United States Patent [19]

Aylward

[11] Patent Number: 4,467,287

[45] Date of Patent: Aug. 21, 1984

[54] SIGNAL EXPANDER

[75] Inventor: Joseph R. Aylward, Plymouth, Mass.

[73] Assignee: DBX, Inc., Newton, Mass.

[21] Appl. No.: 385,054

[22] Filed: Jun. 4, 1982

[51] Int. Cl.$^3$ .............................................. H03F 3/68
[52] U.S. Cl. ................................... 330/126; 330/136; 330/141
[58] Field of Search ............... 330/126, 136, 141, 279, 330/281; 333/14; 455/250

[56] References Cited

U.S. PATENT DOCUMENTS 4,220,929  9/1980  Talbot et al. ......................... 330/136

*Primary Examiner*—James B. Mullins
*Assistant Examiner*—Steven J. Mottola
*Attorney, Agent, or Firm*—Schiller & Pandiscio

[57] ABSTRACT

A signal conditioning system is disclosed for modifying the dynamic range of an electrical input signal. The system comprises gain control means for controlling the gain of the input signal as a function of a gain control signal, and control signal generating means for generating the gain control signal. In accordance with one aspect of the present invention the control signal generating means comprises (1) means for generating a first signal as a function of the amplitude of the input signal, and (2) means responsive to the first signal for generating the gain control signal as a function of only those portions of one polarity of the time derivative of the first signal. In accordance with another aspect of the present invention means are provided for substantially lengthening and/or linearizing the release behavior of the control signal waveform applied as the control signal input signal to the gain control means. In accordance with yet another aspect of the invention means are provided for adjustably shaping the release behavior of the control signal input signal to the gain control means.

12 Claims, 3 Drawing Figures

SIGNAL EXPANDER

The present invention relates to electrical signal conditioning systems, and more particularly to systems for modifying the dynamic range of information signals transmitted through or recorded on a dynamic range limited medium.

Signal conditioning systems are widely known for processing electrical signals transmitted through or recorded on a medium which by its nature limits the dynamic range of signals [i.e., the difference in amplitudes (usually measured in decibels) between the strongest and weakest passages of a program signal] which are to be transmitted or recorded. These systems are most often used with audio and video signals so as to preserve the content of the original information signal transmitted or recorded. For example, radio transmission media and tape or other recording media often have a far more limited dynamic range, e.g., about 60 dB, than the dynamic range of many original programs to be transmitted or recorded. Thus, where the original program has a dynamic range of 120 dB, the audio signal transmission through or recording on these media will result in loss of signal dynamics (sometimes deliberately, sometimes not). Consequently, the relative psychoacoustic differences perceived by the listener between the loud and soft passages will be reduced on reception or playback.

By using a signal-conditioning system called a "compressor", the dynamic range of the original audio signal can be compressed, i.e., reduced, prior to transmission or recording; and by using a system called an "expander" the compressed signal can be expanded, i.e., increased, in a complementary manner on reception or playback, thereby preserving the dynamics of the original signal. By way of example, by compressing an original program signal having a dynamic range of 120 dB at a compression ratio of 2:1 the signal can be transmitted through or recorded on a medium with a limited 70 dB range, whereupon the signal can be subsequently expanded on reception or playback in a complementary manner to its original 120 dB range.

One type of expander which has proven commercially successful is a single-band (i.e., the entire frequency spectrum of the signal is transmitted through the same signal pathway) expander of the type comprising a signal detector which produces a control signal as a function of the amplitude of the program input signal. The control signal may be, for example, a function of the peak amplitude, average amplitude, or RMS amplitude of the input signal. This type of single-band expander also comprises a gain control module for modifying the system gain as a function of the amplitude of the control signal. This latter function is typically determined, at least in part by the amount of expansion, i.e., the expansion ratio desired. An example of a system which can function as a single band expander of the type described above is disclosed in U.S. Pat. No. 3,789,143, issued to David E. Blackmer on Jan. 29, 1974. For a multiband expander employing these principles for each of a selected band of frequencies of the input signal, see for example, U.S. Pat. No. 4,177,356 issued to Messrs. Jaeger and Blakely on Dec. 4, 1979.

As mentioned in U.S. Pat. No. 4,220,929 (issued to Messrs. Talbot and Blackmer on Sept. 2, 1980) although single band systems of the type described are fully effective in expanding the input signal upon reception or playback, such systems are often undersensitive to the portions of the input signals, such as signal transients, in which the amplitude varies quickly with respect to time. More specifically, many expanders are unable to follow rapid envelope changes of the electrical input signal without producing undesireable psychoacoustic effects, such as pumping and breathing. These phenomena generally occur when the amplitude of the signal suddenly changes, such as occurs in a signal representative of a musical schfortzando, which produces a sudden surge in volume. In order to overcome these phenomena, many expanders are designed to obtain greater smoothness of expansion by slowing down the expander's ability to follow sudden amplitude changes. As a result, the release time is often too slow to follow musical envelopes such as those, for example, produced by fast tempo, popular music, and therefore, the expansion appears, to the listener, to have little or no effect. Attempts to decrease the release time of these types of singleband expanders increases the ripple in the control signal to the gain control amplifier resulting in an increase in low frequency distortion, as well as increasing the afore-mentioned pumping and breathing effects.

U.S. Pat. No. 4,220,929 discloses a signal conditioning system which reduces the problems of these prior art devices. The patented system includes means for varying the amplitude of the control signal, at least in part, as a function of the time derivative of that control signal. More particularly, the preferred embodiment shown in the patent includes a detector for sensing the input signal. The detector produces a D.C. signal as a function of the amplitude of the sensed input signal. This D.C. signal is applied to the input of a proportional-derivative circuit. The latter produces a D.C. signal output which varies as a function of the first time derivative of the amplitude of the detector output D.C. signal. The circuit is designed so that a sudden change in dynamics of the input signal which produces a rapid change in the D.C. output signal of the detector, brings about a large change in the transmittance of the proportional derivative circuit. The amount of change in transmittance of this circuit is a function of the first time derivative. The output of this proportional derivative circuit is coupled to the control terminal of a gain control module through a unidirectional lead-lag circuit for processing the control signal output of the derivative circuit so as to provide relatively long release time for low distortion and smooth action in the expansion of signals transmitted through the gain control module. This lead-lag circuit includes a diode and a first resistor connected in parallel and provides added expansion when a very large increase in signal is detected. The diode and resistor of this lead-lag circuit assume that the type of extra expansion to be provided is that provided by positive changing signals at the input terminal of this lead-lag circuit since only the first resistor conducts for negative changing signals, while both the diode and first resistor conduct (thereby providing a much smaller resistance) to positive changing signals. Thus, the diode is forward biased so as to provide an almost instantaneous change in the signal output of the gain control module when these positive changing signals occur. A charging discharging resistor and capacitor at the output of the lead-lag circuit are respectively provided with relatively large resistance and capacitance values so that for such fast positive changing signals, the resistor of the network prevents the capacitor from charging the capacitor. Where the diode is reversed biased, the signal is transmitted only through the first resistor, and the capacitor is allowed to charge through the first resistor and the charge-discharge resistor. In this regard the program dependent release time formed by the first resistor, and to a lesser extent the charge-discharge resistor, and capacitor determine the release characteristics of the system, with a fast discharge occurring when there is a fast drop in voltage at the input to this lead-lag circuit.

The system shown in U.S. Pat. No. 4,220,929 is an improvement over the preexisting prior art since it increases the apparent impact on transient signals without accompanying pumping and breathing, and yet allows a fairly long release time for low distortion and smooth action. However, the proportional-derivative and unidirectional lead-lag circuits of the systems shown are bipolar and do not distinguish between positively increasing and negatively increasing signals. As a result, while the response to positively increasing signals is usually satisfactory, the response to negatively increasing signals can affect the resulting envelope of the output of the gain control module, typically resulting in a particular type of psychoacoustic type of distortion.

Further, the release behavior characteristic of the gain control module is non-linear which also effects the envelope of the output signal. While the patentees suggest that the principles disclosed in their patent can also be applied to multiband expanders, there is no appreciation for the fact that the signal energy input signals of many programs behave differently in different portions of the spectrum when differentiated due to the time constants set by the values of the resistors and capacitors of the proportional-derivative circuit. The values of the resistors and capacitors of the unidirectional lead-lag circuit are chosen to provide a precise time constant for a particular type of release behavior. However, programs can vary, with some requiring slightly different release behavior characteristics. Further, it may be desirable to have faster release for some types of programming than for others.

It is an object of the present invention to provide a signal conditioning system which is an improvement over the one described in U.S. Pat. No. 4,220,929.

Another object of the present invention is to provide a signal conditioning system which substantially reduces or overcomes the above-noted problems of the prior art.

And another object of the present invention is to provide an improved signal conditioning system of the type described in U.S. Pat. No. 4,220,929 in which the derivative circuit responds to at least a portion of only one polarity of the time derivative.

Yet another object of the present invention is to provide an improved signal conditioning system of the type described in U.S. Pat. No. 4,220,929 in which the gain control signal applied to the control terminal of the gain control module releases more linearly with respect to time.

Still another object of the present invention is to provide an improved signal conditioning system of the type described in U.S. Pat. No. 4,220,929 in which the gain control signal applied to the control terminal of the gain control module can be selectively lengthened with respect to time.

And yet another object of the present invention is to provide an improved signal conditioning system of the type described in U.S. Pat. No. 4,220,929 in which the release behavior characteristics of the gain control signal waveform are easily adjustable.

And still another object of the present invention is to provide an improved multiband signal conditioning system of the type described in U.S. Pat. No. 4,220,929 in which the time constants of the derivative circuits are adjusted for each band.

These and other objects of the present invention are achieved by a signal conditioning system for modifying the dynamic range of an electrical input signal, said system comprising gain control means for controlling the gain of the input signal as a function of a gain control signal, and control signal generating means for generating said gain control signal. In accordance with one aspect of the present invention the control signal generating means comprises (1) means for generating a first signal as a function of the amplitude of the input signal, and (2) means responsive to the first signal for generating the gain control signal as a function of at least a portion of only one polarity of the time derivative of the first signal. In accordance with another aspect of the present invention means are provided for substantially linearizing and/or lengthening the release behavior of the control signal waveform applied to the control signal input terminal of the gain control means. In accordance with yet another aspect of the invention means are provided for adjustably shaping the release behavior of the control signal input signal to the gain control means.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein.

Figure 1:
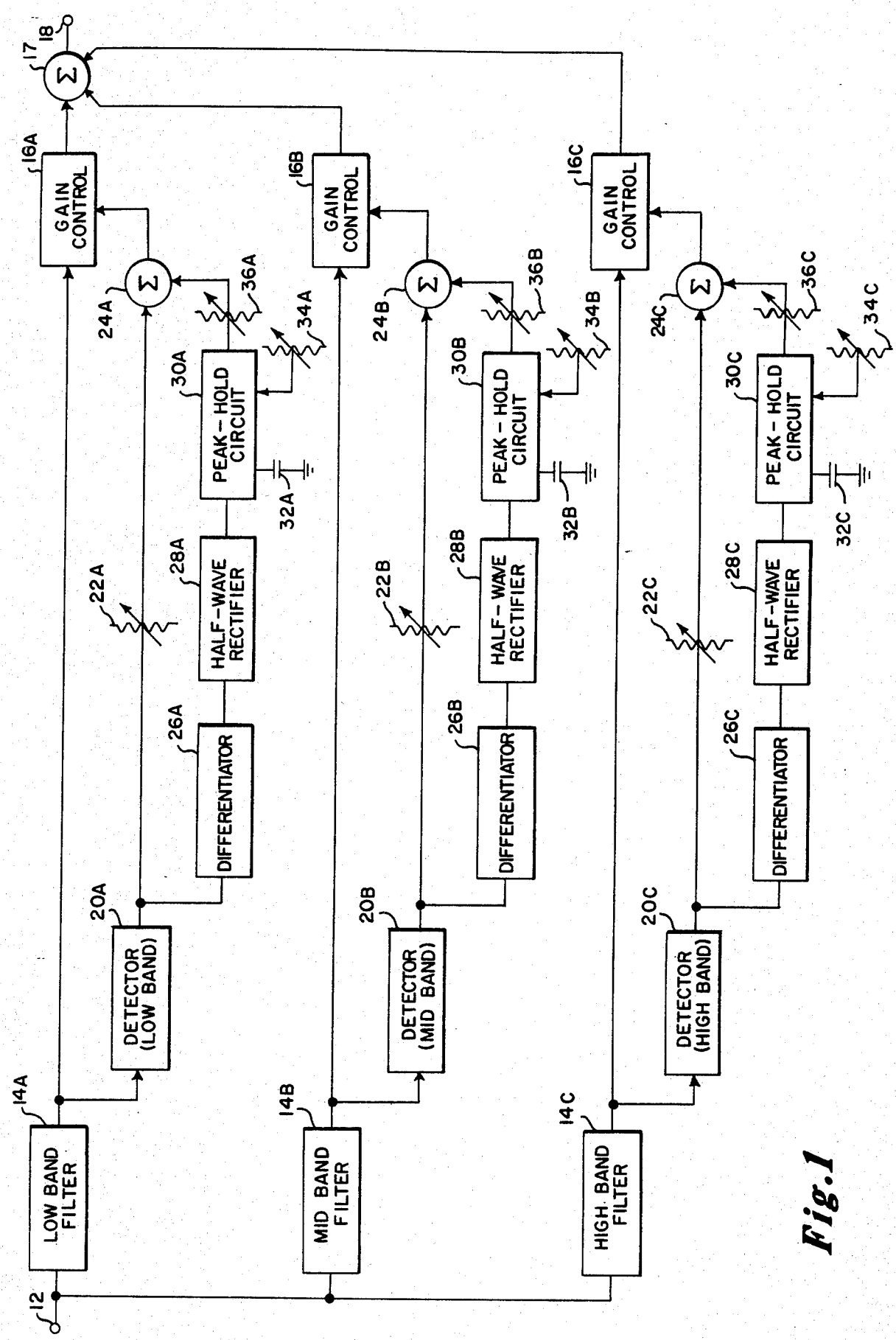
FIG. 1 is a block diagram of the preferred embodiment of the present invention.

Referring to the drawings wherein the same numerals are used to designate like parts, the signal conditioning system is shown as a multiband system comprising three bands each of a preselected bandwidth. It should be appreciated that the number of bands is matter of choice and design and may vary from as few as one band to as many as desired depending upon design considerations. Further, the system is shown as an expander, it should be understood that the principles of the present invention can apply equally to signal compressors.

The system has an input terminal 12 adapted to receive an information signal. Terminal 12 is applied to the input of each filter 14 for each band of interest. In FIG. 1 filter 14A is the low band filter, filter 14B is the midband filter and filter 14C is the high band filter. Filter 14A may be, for example, a two-pole, low pass filter having a three dB cut-off at 200 Hz, filter 14C may be a two-pole high pass filter having a three dB cut-off at 4 Khz, and the filter 14B may be the signal energy derived from subtracting the signal energy output of the low band filter 14A and the high band filter 14C from the entire input signal at input terminal 12, a technique described in U.S. Pat. No. 4,177,356.

The outputs of filters 14A, 14B and 14C are applied respectively to the signal input terminals of gain control modules 16A, 16B and 16C. Each gain control module is preferably a voltage control amplifier of the type described in U.S. Pat. No. 3,714,412 issued to David E. Blackmer on Jan. 30, 1973, with internal additional buffer and attenuating circuitry, such circuitry being well known. The gain of voltage control amplifier is a function of the D.C. control signal applied to the control signal input terminal. Such voltage control amplifiers are commercially available from DBX, Inc. of Newton, Mass., the assignee of the present application. The outputs of the modules 16A, 16B and 16C are summed together by summing means 17 and provided at the system output terminal 18.

The outputs of filters 14A, 14B and 14C are also applied to the respective inputs of the signal detectors 20A, 20B and 20C. Each detector 20 is preferably an RMS detector of the type shown and described in U.S. Pat. No. 3,681,618 issued to David E. Blackmer on Aug. 1, 1972. Such an RMS detector provides a negative D.C. voltage signal at its output terminal as a function of the RMS amplitude of the signal appearing at its input terminal. It will be appreciated, however, that other types of detectors can be utilized such as average and peak detectors.

The output of each detector 20A, 20B and 20C is connected through a respective variable signal attenuator 22A, 22B and 22C (such as a variable resistor) to the corresponding summers 24A, 24B and 24C. The output of each detector 20A, 20B and 20C is also respectively connected to the input of a time-derivative circuit in the form of the differentiator 26A, 26B and 26C. Each differentiator 26 provides an output signal which is a function of the first time derivative of the detector output signal. Each differentiator 26 is provided with time constants which are optimized for the particular frequency band. In general, as will be apparent hereinafter, the time constants are reduced with increasing frequency.

The output of each differentiator 26A, 26B and 26C is coupled to suitable unidirectional conduction means, preferably in the form of half-wave rectifiers 28A, 28B and 28C for transmitting the output signals of only one polarity from the corresponding differen- tiator.

The output of each rectifier 28A, 28B and 28C is coupled to means in the form of peak-hold circuits 30A, 30B and 30C for selectively lengthening the wave form provided by the output of each rectifier 28A, 28B and 28C, as well as substantially linearizing the time release behavior thereof. Each circuit 30A, 30B and 30C preferably respectively includes a capacitor 32A, 32B and 32C and variable resistors 34A, 34B and 34C, the resistor and capacitor of each band determining the gain control time constants and therefore the slope of the release behavior characteristics of the gain control signal wave form. The time constant of each circuit 30 is preferably optimized for the particular frequency band for which the circuit is used, with the time constant decreasing with increasing frequency. It should be appreciated that while a peakhold circuit 30 is shown for linearizing and selectively lengthening the release behavior characteristics of the output of each rectifier 28A, 28B and 28C, other devices, such as operational transconductance amplifiers can be used, depending upon design considerations.

The output of each peak-hold circuit 30A, 30B and 30C is respectively coupled through variable signal attenuation means 36A, 36B and 36C (such as a variable resistor) to an input of summers 24A, 24B and 24C. The output of each summer 24A, 24B and 24C is respectively coupled to the gain control signal input terminal of the respective module 16A, 16B and 16C.

Figure 2:
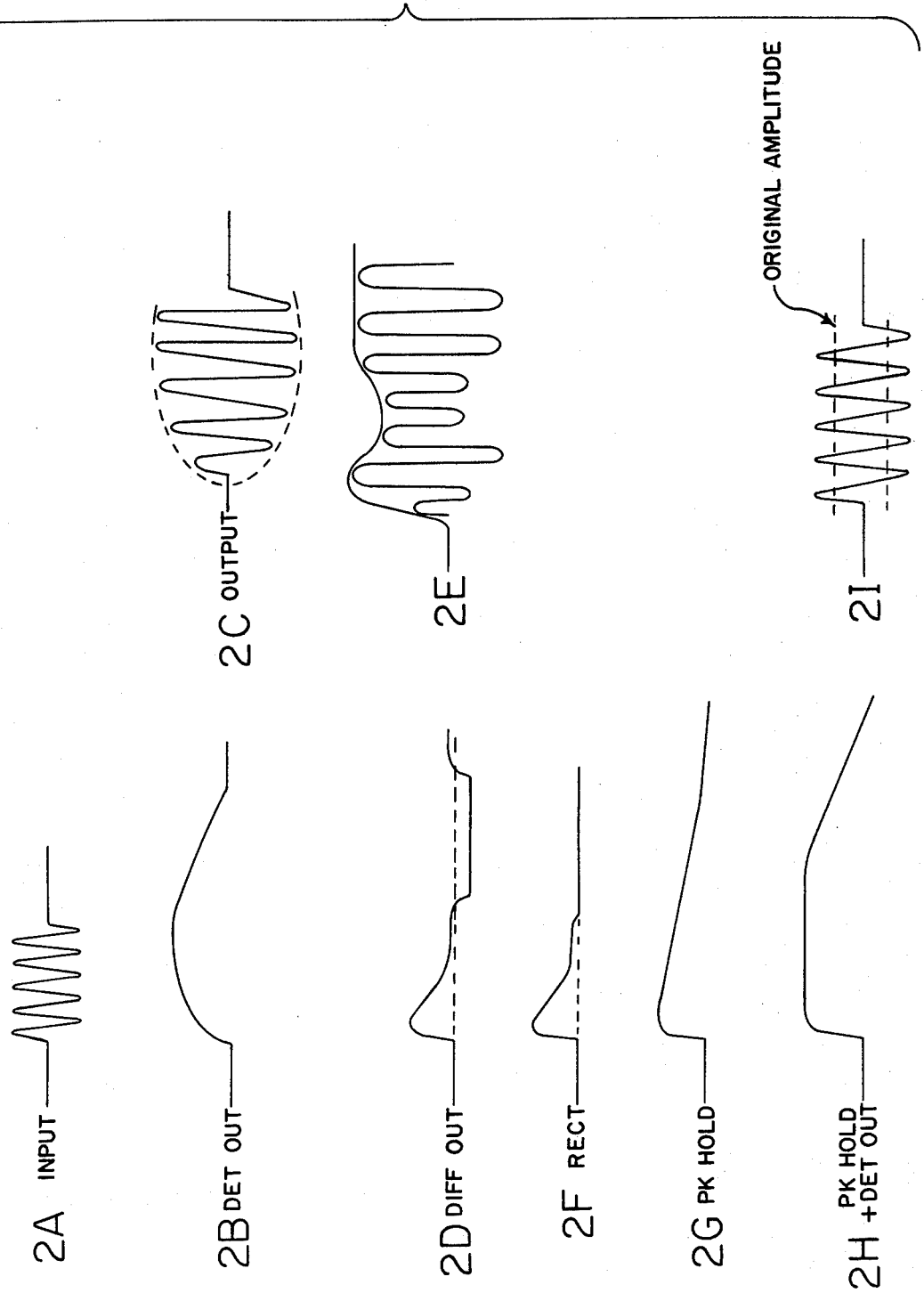
FIG. 2 is a graphical representation of examples of waveforms to illustrate the advantages of the present invention over the prior art devices.

The various aspects of the embodiment of the invention shown in FIG. 1 will be more evident from a description of the waveforms shown in FIG. 2. In FIG. 2 for purposes of illustration the output of each detector 16 is assumed to be positive, when in fact it is negative so that the waveforms shown in FIGS. 2B, 2D, 2F, 2G and 2H will actually be inverted. A simplified input signal applied to the input terminal 12 of the system is shown at 2A. The output signal response of an RMS type detector connected to the input terminal 12 shown at 20 would be similar to the waveform shown at FIG. 2B. If the output of the RMS detector were applied directly to the control signal input terminal of gain control module 16, the output of module 16 would be similar to that shown in FIG. 2C. As shown the envelope of the output signal does not follow (i.e., is not similar in a geometric sense) that of the input signal particularly during the attack time when the initial portion of the signal is provided. In other words there is a certain lag time for the system to catch up. This phenomenon can be pyschoacoustically disconcerting to the listener. Applying the output of the detector 20 to the differentiator as in U.S. Pat. No. 4,220,929, provides an output of the differentiator similar to that shown in FIG. 2D. However, the differentiator is responsive to both positive and negative changing signals, as shown in FIG. 2D. Applying this signal to the control signal input terminal produces at the output of module 16 a waveform similar to that shown in FIG. 2E. As shown due to the negative portion of the differentiator output a dip in the envelope occurs which is a distortion from the original input signal of FIG. 2A, and accordingly the signals are not similar in a geometric sense. This distortion can be noticed by the listener. Accordingly, the output of each differentiator is transmitted through the corresponding rectifier to remove the negative portions of the output signal of each differentiator making this portion of the detection path unipolar. The output of each rectifier is shown in FIG. 2F. This waveform is lengthened or stretched in time, and its release behavior is substantially linearized by applying the output to the peak-hold circuit. As shown in FIG. 2G the output signal of the peak hold circuit is initially substantially a step function with a substantially linearly sloped release. The slope of the release is controlled by capacitor 32 and the setting of each resistor 34. The output of each detector 20 is added at the respective summer 24 with outputs of the corresponding circuits 30 to produce a waveform similar to that shown in FIG. 2H. The amount of contribution provided by each can be varied by controlling attenuators 22 and 36, with the ability to selectively apply (1) only the output of each detector 20 to the corresponding control signal input terminal of each module, (2) only the output of each peak hold circuit 30 to the corresponding control signal input terminal, or (3) a combination of both as shown. As shown in FIG. 2I the output of the gain control module is almost exactly similar in a geometric sense to that of the original signal.

Figure 3:
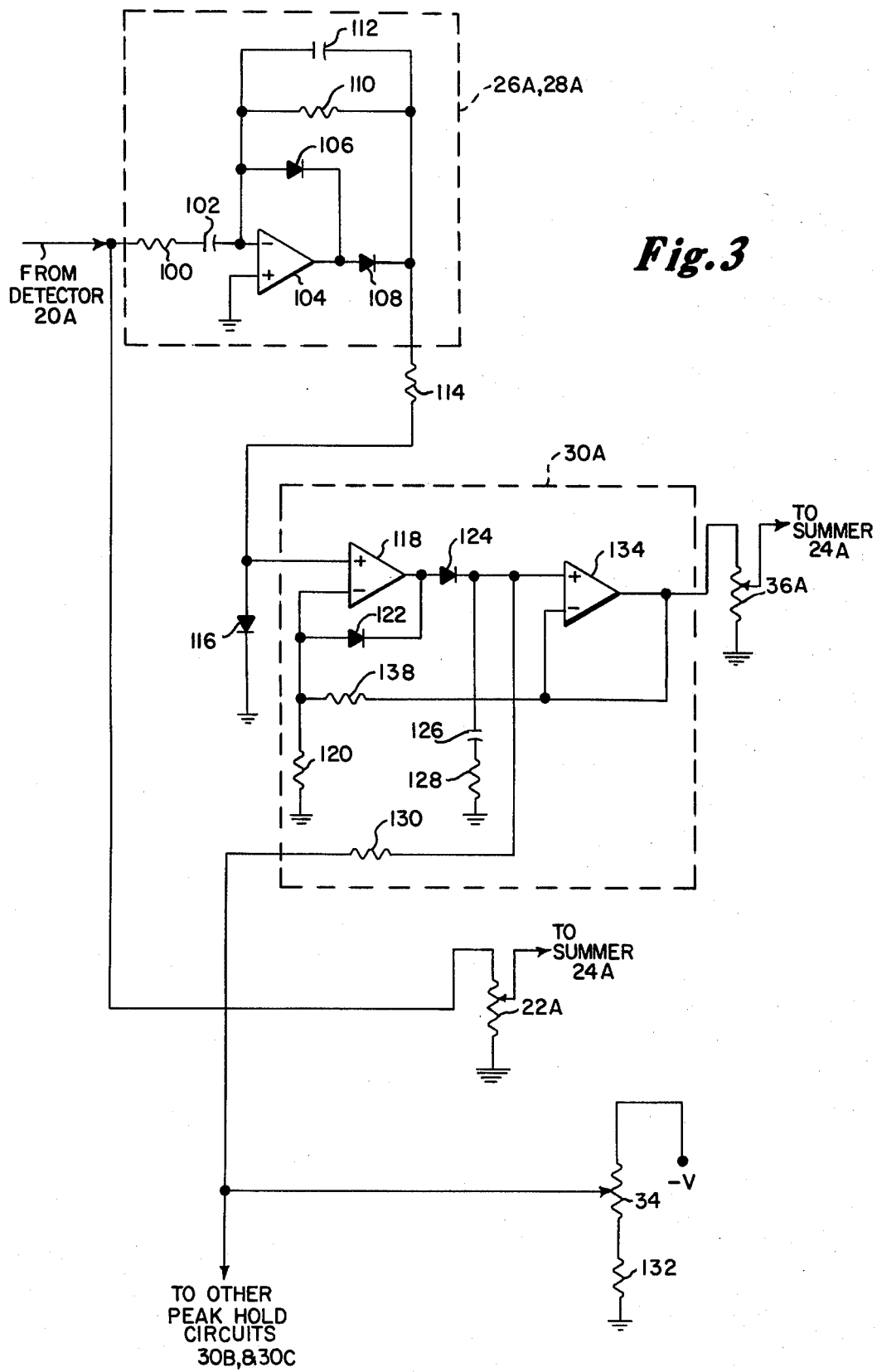
FIG. 3 is a circuit schematic diagram of the detection path of one band of the embodiment shown in FIG. 1.

Referring to FIG. 3 the schematic diagram illustrates those portions of the circuit provided between each detector 20 and each summer 24. The circuit schematic is the same for each band, it being understood that the resistor and capacitor values differ for each band, the values of each band of the preferred three band expander being described hereinafter in Tables I, II and III.

In FIG. 3 the output of the detector is applied to the input of the combined differentiator 26 and rectifier 28. The input of this portion of the circuit is connected to resistor 100, which in turn is connected through capacitor 102 to the inverting input of operational amplifier 104. The noninverting input of amplifier 104 is connected to the system ground. The output of operational amplifier 104 is connected in a feedback path by connecting it to the cathode of diode 106, the latter having its anode connected to the inverting input of the amplifier. The output of amplifier 104 is also connected to the anode of diode 108, which in turn has its cathode connected to feedback paths one through resistor 110 and the other through capacitor 112, to the inverting input of the amplifier 104.

The cathode of diode 108 is connected through resistor 114 to the anode of the clamping diode 116, the latter having its cathode connected to system ground. The anode of diode 116 is also connected to the noninverting input of operational amplifier 118. The inverting input of amplifier 118 is connected through resistor 120 to system ground and to the anode of diode 122. The cathode of diode 122 is connected to the output of amplifier 118, the latter being also connected to the anode of diode 124. The cathode of diode 124 is connected to one plate of capacitor 126, the other plate of the capacitor being connected through resistor 128 to system ground. The cathode of diode 124 is also connected through resistor 130 to the variable resistor 34. The latter is biased with a negative voltage and is connected through resistor 132 to system ground. The cathode of diode 124 is also connected to the positive input of the operational amplifier 134, the latter having its inverting input connected directly to its output, and through resistor 138 to the inverting input of amplifier 118. The output of amplifer 134 is also connected to one end of the variable resistor 36A. The other end of the resistor 36A is connected to system ground, while its wiper is connected to one input of summer 24A. It is further noted that the output of detector 20A is connected directly to one end of a variable resistor 22A, the other end of which is connected directly to system ground. The wiper of variable resistor 22A is connected to the other input of summer 24A.

As shown in FIG. 3, the operational amplifier 104 will provide the necessary differentiation. The values of capacitor 102 and resistor 100, together with the values of resistor 110 and capacitor 112 can be selected to provide an optimized time constant for the particular bandwidth of interest. Diode 108 provides the halfwave rectification. Resistor 114 functions to limit the output current of amplifier 104. Diode 116 clamps the output waveform and prevents the voltage applied to the input of amplifier 118 from exceeding too great a value. Capacitor 126 (capacitor 32 in FIG. 1) together with the values of resistors 130, 132 and 34 determine the time constant of the release of the peak hold circuit 30. Thus, adjusting resistor 34 will vary this time constant. Resistor 34 also controls the release rate of all the bands since it is commonly connected. Resistor 128 allows relatively fast, almost instantaneous changes in the signal to pass through the peak hold circuit. As previously described variable resistors 22A and 36A determine how much of the output of the peak hold circuit 30 and the output of the detector 20 are added together before being added to the summing means 24.

The specific values of the resistors and capacitors of the preferred embodiment of the three band system components shown in FIG. 3 are given in the following Table I (for the low band frequencies), Table II (for the mid band frequencies), and Table III (for the high band frequencies), with all resistances being expressed in ohms and all capacitors being expressed in microfarads. Preferably, the resistor 132 has a 7.5K ohm value, and variable resistor 34 is a 50K resistor.

TABLE I

| LOW BAND | |
|---|---|
| Element | Value |
| 100 | 6.8K |
| 102 | 1.0 |
| 110 | 13K |
| 112 | 0.47 |
| 114 | 470 |
| 120 | 10K |
| 126 | 1.0 |
| 128 | 470 |
| 130 | 4.7M |
| 136 | 10K |

TABLE II

| MID BAND | |
|---|---|
| Element | Value |
| 100 | 3.3K |
| 102 | 1.0 |
| 110 | 6.8K |
| 112 | 0.47 |
| 114 | 470 |
| 120 | 10K |
| 126 | 1.0 |
| 128 | 470 |
| 130 | 2.2M |
| 136 | 10K |

TABLE III

| HIGH BAND | |
|---|---|
| Element | Value |
| 100 | 3.3K |
| 102 | 0.47 |
| 110 | 6.8K |
| 112 | 0.047 |
| 114 | 470 |
| 120 | 10K |
| 126 | 1.0 |
| 128 | 470 |
| 130 | 1.2M |
| 136 | 10K |

The system described above has many advantages. By using a half-wave rectifier 28 for each band the detection path through each of these elements is unipolar and therefore responsive to detector output signals which are changing in only one direction, i.e., when the input signal at terminal 12 is increasing in magnitude so as to further improve on the apparent impact on transient signals. Further, the release behavior characteristics of the control signal at the control terminal input to each gain control module 16 is substantially lengthened and linearized with respect to time by using the peak hold circuits, with the nature of the release being controlled by the adjustment of variable resistor 34. By selecting the proper values of resistors 100 and 110 and capacitors 102 and 112, the time constants of the differentiator 26 can be optimized for each band, with the time constants generally decreasing with increasing frequency. The amount of control signal from amplifier 134 which is applied to the control signal terminal of gain control module 16 is determined by the setting of resistor 36.

Since certain changes may be made in the above apparatus without departing from the scope of the invention herein involved, it is intended that all matter contained in the above description or shown in the drawings shall be interpreted in an illustrative and not a limiting sense.

What is claimed is:

1. A signal conditioning system for modifying the dynamic range of an electrical input signal, said system comprising:
   gain control means for controlling the gain of said input signal as a function of a gain control signal;
   control signal generating means for generating said gain control signal, said control signal generating means comprising:
   (1) means for generating a first signal as a function of the amplitude of the input signal, and
   (2) means responsive to said first signal for generating said gain control signal as a function of at least a portion of only one polarity of the time derivative of said first signal, said means for generating said gain control signal comprising:
      (a) at least two signal transmission paths, the first of said paths for transmitting said first signal, and the second of said paths including (i) signal differentiator means for generating a second signal as a function of the time derivative of said first and (ii) rectification means for rectifying said second signal, and
      (b) signal summing means for providing said control signal as a function of the addition of the signals transmitted over said two paths.

2. A system according to claim 1, wherein said second path includes signal processing means responsive to said rectified second signal for substantially lengthening the time duration of the waveform of said rectified second signal.

3. A system according to claim 2, wherein said signal processing means includes a peak-hold circuit.

4. A system according to claim 1, wherein said second path further includes signal linearization means responsive to the rectified second signal for substantially linearizing the waveform of said second signal.

5. A system according to any one of claims 1, 2, 3, or 5, wherein each of said signal transmission paths includes variable signal attenuation means for selectively varying the amount of the signal provided over each said path to said signal summing means so that said control signal can be selectively derived from (1) only the signal provided over said first signal transmissive path, (2) only the signal provided over said second signal path, or (3) a combination of (1) and (2).

6. A system according to any one of claims 1, 2, 3, or 5, further including a plurality of transmission channels, each said channel for selectively transmitting the portion of said input signal within a preselected band of frequencies so as to provide a frequency selected signal for each said frequency band, each said channel including a gain control module for controlling the signal gain of said channel as a function of a frequency selected control signal, said system further including a like plurality of said control generating means, each for generating a corresponding one of said frequency selected control signals.

7. A system according to claim 5, wherein each of said signal differentiator means is provided with a time constant optimized for the corresponding frequency band.

8. A system according to claim 6, wherein the time constants of the differentiator means decrease with increasing frequency bands.

9. A system according to claim 5, wherein each of said peak-hold circuits is provided with a time constant optimized for the corresponding frequency band.

10. A system according to claim 9, wherein the time constants of the peak-hold circuits decrease with increasing bands.

11. A system according to claim 5, further including means for adjusting the release behavior of the waveform of each of said frequency selected control signals.

12. A signal conditioning system for modifying the dynamic range of an electrical input signal, said system comprising:
    gain control means for controlling the gain of said input signal as a function of a gate control signal;
    control signal generating means for generating said gain control signal, said control signal generating means comprising:
    (1) means for generating a first signal as a function of the amplitude of the input signal, and
    (2) means responsive to said first signal for generating said gain control signal as a function of the sum of (a) a second signal linearly related to said first signal and (b) a third signal related to a half-wave rectified portion of the time derivative of said first signal.

* * * * *

UNITED STATES PATENT AND TRADEMARK OFFICE
CERTIFICATE OF CORRECTION

PATENT NO. : 4,467,287
DATED : August 21, 1984
INVENTOR(S) : Joseph R. Aylward

It is certified that error appears in the above-identified patent and that said Letters Patent is hereby corrected as shown below:

Claim 1, column 9, line 34, before "and" please insert -- signal --;

Claim 5, column 9, line 51, please delete "5" and substitute therefor -- 4 --;

Claim 6, colum 10, line 8, please delete "5" and substitute therefor -- 4 --; and Claim 12, column 10, line 39, please delete "gate" and substitute therefor -- gain --.

Signed and Sealed this

Eighth Day of January 1985

[SEAL]

Attest:

*Attesting Officer*

GERALD J. MOSSINGHOFF

*Commissioner of Patents and Trademarks*